(12) United States Patent
Lin

(10) Patent No.: US 6,171,939 B1
(45) Date of Patent: Jan. 9, 2001

(54) METHOD FOR FORMING POLYSILICON GATE ELECTRODE

(75) Inventor: Tony Lin, Kaohsiung Hsien (TW)

(73) Assignees: United Microelectronics Corp.; United Semiconductor Corp., both of Hsinchu (TW)

( * ) Notice: Under 35 U.S.C. 154(b), the term of this patent shall be extended for 0 days.

(21) Appl. No.: 09/348,389

(22) Filed: Jul. 7, 1999

(51) Int. Cl.[7] ................................................. H01L 21/3205
(52) U.S. Cl. .......................... 438/585; 438/287; 257/382
(58) Field of Search ................................. 438/585, 587, 438/588, 591, 592, 595, 287, 288, 289, 586; 257/382, 383

(56) References Cited

U.S. PATENT DOCUMENTS

| | | | |
|---|---|---|---|
| 5,605,848 | * | 2/1997 | Ngaoaran ............................ 438/298 |
| 5,877,050 | * | 3/1999 | Gardner et al. ...................... 438/232 |
| 6,037,204 | * | 3/2000 | Chang et al. ........................ 438/231 |
| 6,037,228 | * | 3/2000 | Hsu ..................................... 438/279 |

* cited by examiner

Primary Examiner—David Nelms
Assistant Examiner—Dung A Le
(74) Attorney, Agent, or Firm—Thomas, Kayden, Horstemeyer & Risley

(57) ABSTRACT

A method for forming a polysilicon gate electrode. A semiconductor is provided. A gate oxide layer, a partially doped polysilicon layer and an undoped polysilicon are sequentially formed over the semiconductor substrate. The undoped polysilicon layer, the partially doped polysilicon layer and the gate oxide layer are patterned to form a gate electrode.

13 Claims, 3 Drawing Sheets

METHOD FOR FORMING POLYSILICON GATE ELECTRODE

BACKGROUND OF THE INVENTION

1. Field of Invention

The present invention relates to a method for forming a semiconductor device. More particularly, the present invention relates to a method for forming a polysilicon gate electrode.

2. Description of Related Art

In the deep submicron regime of semiconductor manufacturing, feature size, contact area, and junction depth are all reduced. To improve the performance of the integrated circuit device and to lower resistance and resistance/capacitance delay, a metal silicide layer is frequently formed as part of a gate electrode in addition to a polysilicon layer. Because the metal silicide layer can be formed without performing a photolithographic operation, the method of forming a silicide layer is often referred to as a self-aligned silicide (Salicide) process. Most salicide layers are formed using titanium silicide ($TiSi_x$). Titanium silicide is often used because it has a low resistivity. In addition, a titanium silicide layer can be formed in a controlled manner so that quality and reliability can always be maintained.

However, with the reduction of dimensions of a polysilicon gate electrode, forming a high-quality metal silicide layer above the polysilicon gate electrode is becoming difficult. Growth of the metal silicide layer is stunted by the high level of stress between the metal silicide layer and the polysilicon layer and/or the small number of nucleation sites. Therefore, quality of the silicide layer is likely to deteriorate, sheet resistance of the silicide layer is likely to increase, and performance of the gate electrode will be compromised. For a device whose line width is smaller than 0.18 μm, quality of the silicide layer is often improved by performing a pre-amorphization implant (PAI) before carrying out the salicide process. The PAI converts a surface layer of the polysilicon into an amorphous silicon layer so that sheet resistance of the subsequently formed salicide layer decreases.

FIGS. 1A through 1C are schematic, cross-sectional view showing the progression of steps for forming a conventional gate electrode. As shown in FIG. 1A, a semiconductor substrate 100 having device isolation structures 102 therein is provided. A gate oxide layer 104 and a doped polysilicon layer 106 are sequentially formed over the substrate 100. The gate oxide layer 104 and the doped polysilicon layer 106 are patterned to form a gate electrode 108. To prevent diffusion of light due to surface roughness, an anti-reflection coating 110, typically made from silicon oxynitride, is formed over the polysilicon layer 106 before the gate oxide layer 104 and the polysilicon layer 106 are patterned. After the polysilicon layer 106 is patterned, hot phosphoric acid is used to remove the anti-reflection coating 110. However, in the process of removing the anti-reflection coating 110, a portion of the doped polysilicon layer 106 may be damaged by phosphoric acid. Therefore, a portion of the polysilicon layer in the gate structure may peel off resulting in a degradation of device's performance characteristics.

As shown in FIG. 1B, an pre-amorphization implant (PAI) is carried out implanting arsenic ions into the polysilicon gate electrode 108 so that a surface layer of the polysilicon layer 106 is broken down into an amorphous silicon layer 112. The amorphization of the polysilicon layer 106 facilitates the subsequent formation of a silicide layer. Source/drain regions 114 having a lightly doped drain (LDD) structure is formed in the substrate 100 on each side of the gate electrode 108.

However, the arsenic (atomic weight=74.9) ions used in the PAI has a relatively high atomic weight. Due to the presence of many large grains inside the polysilicon layer 106, arsenic ions is able to move along grain boundaries and contact surfaces of the polysilicon layer 106 and the gate oxide layer 104. Ultimately, the arsenic ions will end up in the channel region of the substrate 100 leading to an intensification of kink effect and the downgrading of device quality.

A layer of titanium (not shown in the figure) is sputtered over the substrate 100. Using a rapid thermal process, metal in the titanium layer reacts with silicon in the doped polysilicon layer 106 and silicon in the source/drain regions 114 to form a titanium silicide layer 116. The unreacted titanium is removed by wet etching to form the structure as shown in FIG. 1C.

In the self-aligned silicide process, some of the dopants within the polysilicon layer 106 will hinder the diffusion of silicon to the titanium layer. The prevention of silicon by dopants is referred to as a dopant effect. Without enough silicon to react with titanium to form a titanium silicide layer, the formation of a high-quality silicide layer is almost impossible.

SUMMARY OF THE INVENTION

Accordingly, the purpose of the present invention is to provide a method for forming polysilicon gate electrode capable of reducing the peeling of polysilicon gate layer due to the removal of anti-reflection coating by phosphoric acid. The method is also capable of moderating kink effect due to penetration of ions in PAI, and dopant effect due to prevention of silicon diffusion by dopants within the polysilicon gate layer.

To achieve these and other advantages and in accordance with the purpose of the invention, as embodied and broadly described herein, the invention provides a method for forming a polysilicon gate electrode. A semiconductor substrate is provided. A gate oxide layer, a partially doped polysilicon layer and an undoped polysilicon layer are sequentially formed over the semiconductor substrate. The undoped polysilicon layer, the partially doped polysilicon layer and the gate oxide layer are patterned to form a gate electrode.

The invention also provides a method for forming a metal-oxide-semiconductor (MOS) transistor. A semiconductor substrate having device isolation structures therein is provided. A gate oxide layer, a partially doped polysilicon layer and an undoped polysilicon layer are sequentially formed over the substrate. The partially doped polysilicon layer and the undoped polysilicon layer are patterned to form a gate electrode. Using the gate electrode as a mask, a lightly doped drain region is formed in the substrate on each side of the gate electrode. Spacers are formed on the sidewalls of the gate electrode. Using the gate electrode and the spacers as a mask, a heavily doped region is formed in the substrate. A metal silicide layer is formed at a top surface of the gate electrode and a top surface of the heavily doped region of the substrate.

An anti-reflection coating can be formed prior to the patterning of the partially doped polysilicon layer and the undoped polysilicon layer. The stacked polysilicon gate electrode of this invention includes an undoped polysilicon layer and a doped polysilicon layer. Since the undoped polysilicon layer is on top to protect the doped polysilicon layer when hot phosphoric acid is used to remove the anti-reflection coating, the doped polysilicon layer is less likely to peel off due to the acid.

In addition, due to the formation of an undoped polysilicon layer above a doped polysilicon layer, dopant effect caused by the presence of dopants inside a doped polysilicon layer in a self-aligned silicide process can be greatly reduced. Hence, quality of the silicide layer will be greatly improved.

Furthermore, the stacked polysilicon gate electrode structure of this invention is able to provide an additional interface. Consequently, when arsenic ions are implanted in a PAI, less arsenic ions will be able to pass through the gate electrode and ends up in the substrate. Without additional arsenic ions in the channel of the substrate, kink effect will be subdued.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
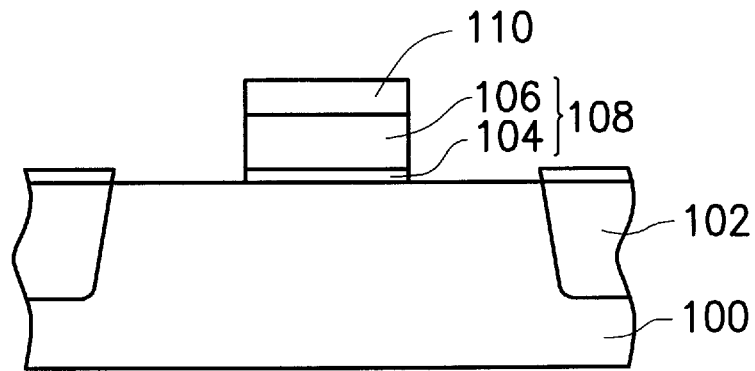
FIGS. 1A through 1C are schematic, cross-sectional view showing the progression of steps for forming a conventional gate electrode.
Figure 1B:
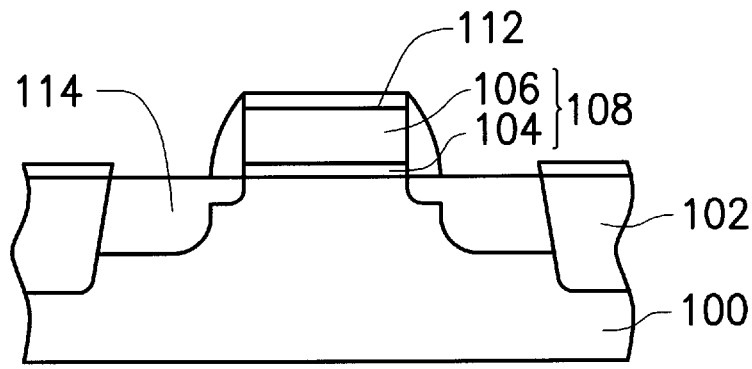
Figure 1C:
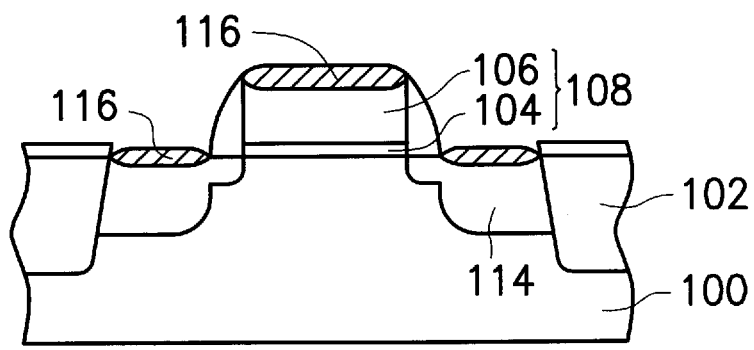

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional view showing the progression of steps for forming a polysilicon gate electrode according to a preferred embodiment of this invention. In the following, fabrication of a polysilicon gate electrode of an N-type metallic-oxide-semiconductor (NMOS) transistor is chosen as an example.

Figure 2A:
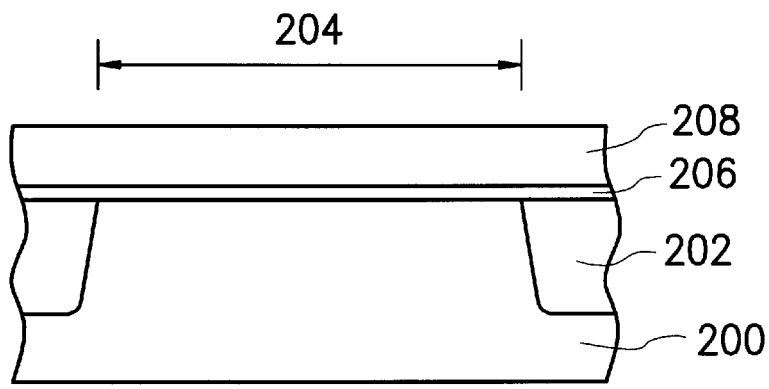
FIGS. 2A through 2F are schematic, cross-sectional view showing the progression of steps for forming a polysilicon gate electrode according to a preferred embodiment of this invention.

As shown in FIG. 2A, a substrate 200 such as a P-type semiconductor substrate is provided. Device isolation structures, for example, shallow trench isolation (STI) structures are formed in the substrate 200 so that an active region 204 is marked out. A gate oxide layer 206 is formed over the substrate 200. The gate oxide layer 206 can be formed, for example, by performing a thermal oxidation. An undoped polysilicon layer 208 is formed over the gate oxide layer 206. The undoped polysilicon layer 208 having a thickness of between 1200 Å to 1800 Å, and preferably about 1500 Å, is formed, for example, by chemical vapor deposition.

Figure 2B:
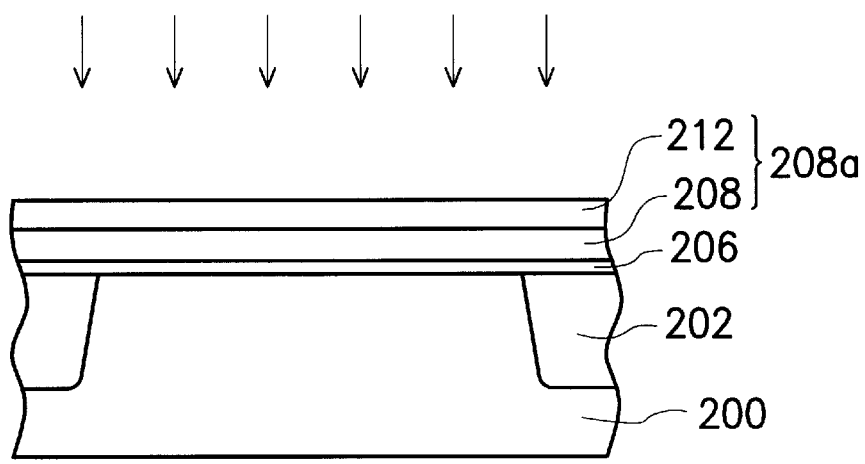

As shown in FIG. 2B, an ion implant is carried out to convert a top layer of the undoped polysilicon layer 208 into a doped polysilicon layer 212. Arsenic or phosphorus ions, for example, can be used in the ion implant. Preferably, an energy level of between 20 eV to 40 eV and a dosage of between 1E15 to 5E15 atoms/cm$^2$ are used in the implantation. The undoped polysilicon layer 208 and the doped polysilicon layer 212 together form a partially doped polysilicon layer 208a.

Figure 2C:
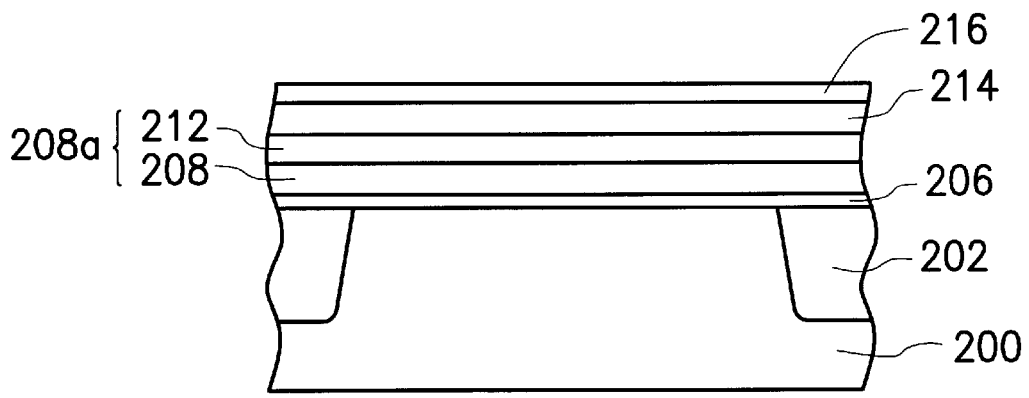

As shown in FIG. 2C, another undoped polysilicon layer 214 is formed over the partially doped polysilicon layer 208a. The undoped polysilicon layer 214 having a thickness of between 300 Å to 800 Å, preferably about 500 Å, can be formed, for example, by chemical vapor deposition (CVD). An anti-reflection coating 216 is formed over the undoped polysilicon layer 214. The anti-reflection coating 216 can be formed using a material such as silicon oxynitride (SiON). The purpose of having an antireflection coating 216 over the polysilicon layer 214 is for increasing the precision in subsequent pattern transfer and development of photoresist layer.

Figure 2D:
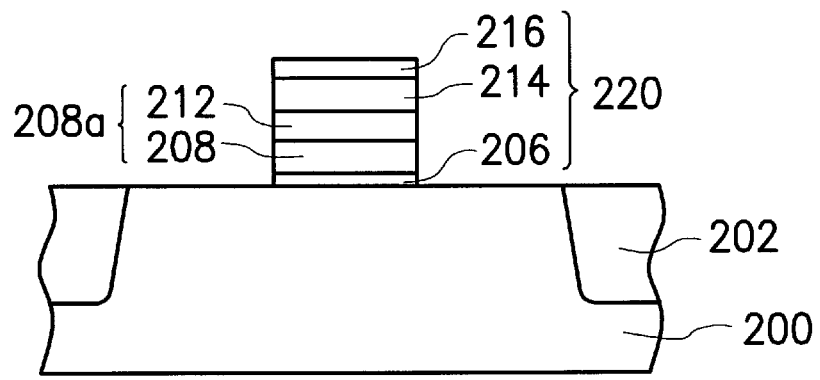

As shown in FIG. 2D, using conventional photolithographic and etching techniques, the gate oxide layer 206, the partially doped polysilicon layer 208a, the undoped polysilicon layer 214 and the anti-reflection coating 216 are patterned to form a gate electrode 220. The anti-reflection coating 216 is removed using hot phosphoric acid, for example. Since the partially doped polysilicon layer 208a is protected by the overlying undoped polysilicon layer 214, peeling of the polysilicon gate electrode due to the removal of anti-reflection coating 216 by hot phosphoric acid is avoided.

Figure 2E:
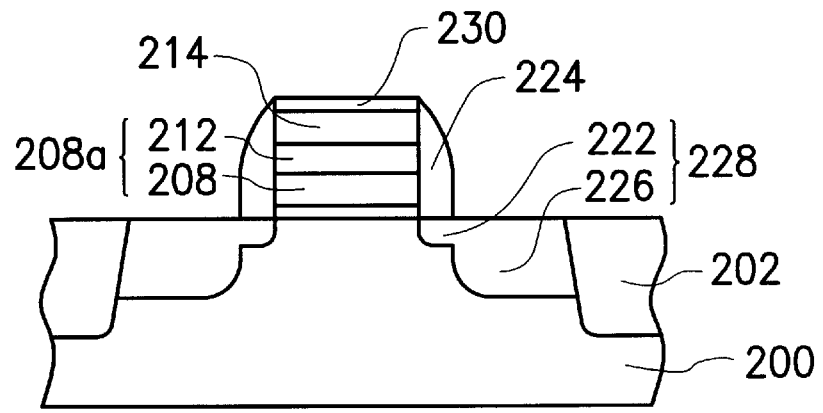

As shown in FIG. 2E, using the gate electrode 220 as a mask, an ion implant is carried out to form lightly doped regions 222 in the substrate 200 on each side of the gate electrode 220. Spacers 224 are formed on the sidewalls of the gate electrode 220. The spacers 224 can be a silicon nitride layer or a silicon oxide layer, for example. Using the gate electrode 220 and the spacers 224 as a mask, another ion implant is carried out to form heavily doped regions 226 in the substrate 200 just outside the lightly doped regions 222. The lightly doped regions 222 and the heavily doped regions 226 together constitute source/drain regions 228 that have a lightly doped drain (LDD) structure. A pre-amorphization implant (PAI) is next carried out converting a surface layer of the gate electrode 220 into an amorphous layer 230. By performing an amorphization operation, more nucleation sites are created that permit the formation of a high-quality silicide layer in subsequent self-aligned silicide process. The PAI is carried out using arsenic ions, for example. Up to this stage, a MOS transistor is formed.

Although the formation of an NMOS gate electrode is illustrated so far, the aforementioned steps can also be carried out to form a PMOS gate electrode, a complementary MOS (CMOS) gate electrode or a dual-gate gate electrode.

Since the stacked gate electrode 220 includes the undoped polysilicon layer 214 and the partially doped polysilicon layer 208a, an interface is formed between the undoped polysilicon layer 214 and the partially doped polysilicon layer 208a. When arsenic ions bombards the polysilicon gate electrode 220 to form a top amorphous silicon layer 230, movement of the arsenic ions is hindered at the interface. Due to the presence of the interface, movement of arsenic ions down to the substrate 200 following the boundaries of grains within the polysilicon and the gate oxide layer 206 has almost stopped. Therefore, performance degradation due to kink effect is greatly reduced.

Figure 2F:
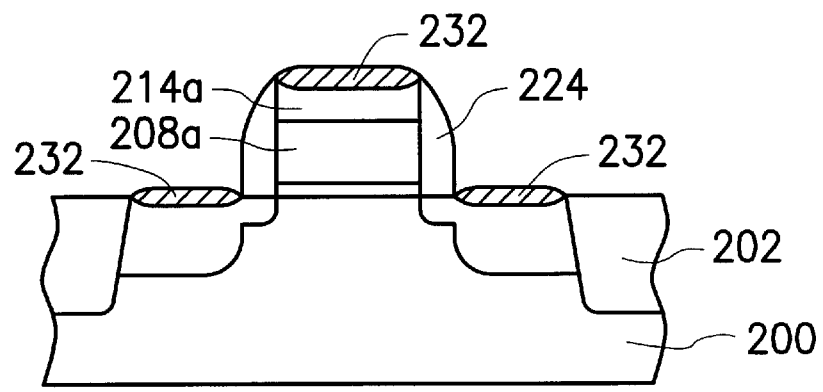

As shown in FIG. 2F, a silicide layer 232 is formed over the source/drain regions 228 and the amorphous silicon layer 230 of the gate electrode 220. The silicide layer 232 is formed, for example, by sputtering to form a metallic layer such as a titanium layer over the substrate 200 and the gate electrode 220. This is followed by performing a rapid thermal process (RTP) so that metal in the metallic layer and silicon in the substrate and the amorphous silicon layer 230 is able to react. Any unreacted metal is subsequently removed by wet etching.

In a conventional self-aligned silicide process, dopants within the polysilicon layer often prevent the diffusion of silicon and hinder the formation of the silicide layer. The situation is changed using the stacked polysilicon gate electrode of this invention because there is an undoped polysilicon layer 214 above the partially doped polysilicon layer 208a. The undoped polysilicon layer 214 has no dopants to hinder the silicide-forming process. Furthermore, the heat generated by the silicide-forming process is able to drive, by diffusion, the dopants inside the partially doped polysilicon layer 208a into undoped polysilicon layer 214. Hence, the undoped polysilicon layer 214 will be converted into a partially doped polysilicon layer 214a, thereby increasing its electrical conductivity.

In summary, the advantages of this invention includes:

1. By forming an undoped polysilicon layer above a partially doped polysilicon layer, the partially doped polysilicon layer is less likely to peel off when hot phosphoric acid is used to remove the anti-reflection coating.

2. Due to the formation of an undoped polysilicon layer above a partially doped polysilicon layer, dopant effect caused by the presence of dopants inside a doped polysilicon layer in a self-aligned silicide process can be greatly reduced. Hence, quality of the silicide layer is improved.

3. The stacked polysilicon gate electrode structure of this invention is able to provide an additional interface. When arsenic ions are implanted in a PAI, less arsenic ions are able to pass through the gate electrode and ends up in the channel region of the substrate. Consequently, kink effect is alleviated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a polysilicon gate electrode, comprising the steps of:

providing a substrate;

forming a gate oxide layer over the substrate;

forming a first undoped polysilicon layer on the gate oxide layer;

performing an ion implantation step on a top portion of the first undoped polysilicon layer for forming a doped polysilicon layer, wherein the doped polysilicon layer and remaining portion of the first undoped polysilicon layer forms a partially doped polysilicon layer over the gate oxide layer;

forming an second undoped polysilicon layer directly on the partially doped polysilicon layer; and patterning the partially doped polysilicon layer and the second undoped polysilicon layer.

2. The method of claim 1, wherein the partially doped polysilicon layer has a thickness of about 1200 Å to 1800 Å.

3. The method of claim 1, wherein the second undoped polysilicon layer has a thickness of about 300 Å to 700 Å.

4. The method of claim 1, wherein the step of performing an ion implantation step on a top portion of the first undoped polysilicon layer further includes the substeps of:

forming a photoresist layer over the first undoped polysilicon layer; and implanting ions into the first undoped polysilicon layer using the photoresist layer as a mask.

5. The method of claim 4, wherein the step of implanting ions into the first undoped polysilicon layer includes implanting arsenic ions at an energy level of between 20 eV to 40 eV and a dosage of about 1E15 to 5E15 atoms/cm$^2$.

6. The method of claim 1, wherein before the step of patterning the partially doped polysilicon layer and the second undoped polysilicon layer, further includes forming an anti-reflection coating over the second undoped polysilicon layer.

7. A method for forming a metal-oxide-semiconductor (MOS) transistor, comprising the steps of:

providing a substrate having device isolation structures therein;

forming a gate oxide layer over the substrate;

forming a first undoped polysilicon layer on the gate oxide layer;

performing an ion implantation step on a top portion of the first undoped polysilicon layer for forming a partially doped polysilicon layer over the gate oxide layer;

forming an second undoped polysilicon layer above the partially doped polysilicon layer;

patterning the partially doped polysilicon layer and the second undoped polysilicon layer to form a gate electrode;

forming a lightly doped region in the substrate on each side of the gate electrode using the gate electrode as a mask;

forming spacers on the sidewalls of the gate electrode;

forming a heavily doped region in the substrate on each side of the gate electrode using the gate electrode and the spacers as a mask; and forming a metal silicide layer over a top surface of the gate electrode and a top surface of the heavily doped regions.

8. The method of claim 7, wherein the partially doped polysilicon layer has a thickness of about 1200 Å to 1800 Å.

9. The method of claim 7, wherein step of forming the second undoped polysilicon layer more specifically includes forming the second undoped polysilicon layer to have a thickness of about 300 Å to 700 Å.

10. The method of claim 7, wherein the step of forming the partially doped polysilicon layer further includes the substeps of:

forming a photoresist layer over the first undoped polysilicon layer; and implanting ions into the first undoped polysilicon layer using the photoresist layer as a mask.

11. The method of claim 10, wherein the step of implanting ions into the first undoped polysilicon layer includes implanting arsenic ions at an energy level of between 20 eV to 40 eV and a dosage of about 1E15 to 5E15 atoms/cm$^2$.

12. The method of claim 7, wherein before the step of patterning the partially doped polysilicon layer and the second undoped polysilicon layer, further includes forming an anti-reflection coating over the second undoped polysilicon layer.

13. The method of claim 7, wherein the silicide-forming process also generates enough heat to cause some dopants in the partially doped polysilicon diffuse into the second undoped polysilicon layer so that the second undoped polysilicon layer is ultimately transformed into a second partially doped polysilicon layer.

* * * * *